United States Patent
Chung et al.

(10) Patent No.: US 7,098,135 B2
(45) Date of Patent: Aug. 29, 2006

(54) SEMICONDUCTOR DEVICE INCLUDING BIT LINE FORMED USING DAMASCENE TECHNIQUE AND METHOD OF FABRICATING THE SAME

(75) Inventors: Seung-pil Chung, Seoul (KR); Chang-jin Kang, Suwon (KR); Jeong-sic Jeon, Kyungki-do (KR); Kyeong-koo Chi, Seoul (KR); Seung-young Son, Yongin (KR); Sang-yong Kim, Yongin (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 207 days.

(21) Appl. No.: 10/703,328

(22) Filed: Nov. 7, 2003

(65) Prior Publication Data

US 2004/0137743 A1 Jul. 15, 2004

(30) Foreign Application Priority Data

Jan. 14, 2003 (KR) .................... 10-2003-0002421

(51) Int. Cl.
*H01L 21/311* (2006.01)
(52) U.S. Cl. .................... 438/694; 438/700; 438/720
(58) Field of Classification Search ............... 438/694, 438/700, 702, 703, 704, 706, 720, 723, 724, 438/745, 756, 757, 618, 622, 624
See application file for complete search history.

(56) References Cited

U.S. PATENT DOCUMENTS

| 5,658,816 | A | * | 8/1997 | Rajeevakumar | 438/386 |
|---|---|---|---|---|---|
| 5,700,731 | A | * | 12/1997 | Lin et al. | 438/381 |
| 5,712,202 | A | * | 1/1998 | Liaw et al. | 438/253 |
| 6,534,365 | B1 | * | 3/2003 | Kim et al. | 438/270 |
| 6,730,959 | B1 | * | 5/2004 | Hung et al. | 257/316 |
| 6,740,550 | B1 | * | 5/2004 | Choi et al. | 438/199 |
| 6,767,789 | B1 | * | 7/2004 | Bronner et al. | 438/254 |
| 6,773,983 | B1 | * | 8/2004 | Richter et al. | 438/243 |
| 2001/0033029 | A1 | * | 10/2001 | Lee et al. | 257/774 |

FOREIGN PATENT DOCUMENTS

KR 2001-0063853 7/2001

OTHER PUBLICATIONS

English Abstract of Korean Patent Publication No. 2001-0063853.

* cited by examiner

*Primary Examiner*—Kin-Chan Chen
(74) *Attorney, Agent, or Firm*—F. Chau & Associates, LLC (57) ABSTRACT

A semiconductor device including a bit line formed using a damascene technique and a method of fabricating the same. The method includes forming an insulating layer on a substrate, forming a groove by etching the insulating layer to a partial depth, and forming spacers on the inner walls of the groove. An opening is formed by etching the insulating layer disposed under the groove using the spacers as an etch mask. A conductive layer is formed to fill the opening. A capping layer is formed to fill the groove.

11 Claims, 10 Drawing Sheets

SEMICONDUCTOR DEVICE INCLUDING BIT LINE FORMED USING DAMASCENE TECHNIQUE AND METHOD OF FABRICATING THE SAME

CROSS REFERENCES TO RELATED APPLICATIONS

This application claims priority based on Korean Patent Application No. 2003-02421, filed on Jan. 14, 2003, in the Korean Intellectual Property Office.

BACKGROUND OF THE INVENTION

1. Field of the Invention

The present invention relates to a semiconductor device and a method of fabricating the same. More particularly, the present invention relates to a semiconductor device having conductive layers, such as bit lines, which are closely formed to be parallel, and a method of fabricating the same.

2. Description of the Related Art

As the integration density of semiconductor memory devices, such as DRAMs, increases, more attention is being paid to methods of minimizing chip size. In recent years, DRAM cells having a design rule of 0.11 μm or less have been developed., However, as the design rule and chip size of DRAMs decrease, overcoming restrictions of photolithographic processes used to form the DRAMs and securing a sufficient process margin become more complicated.

Figure 1:
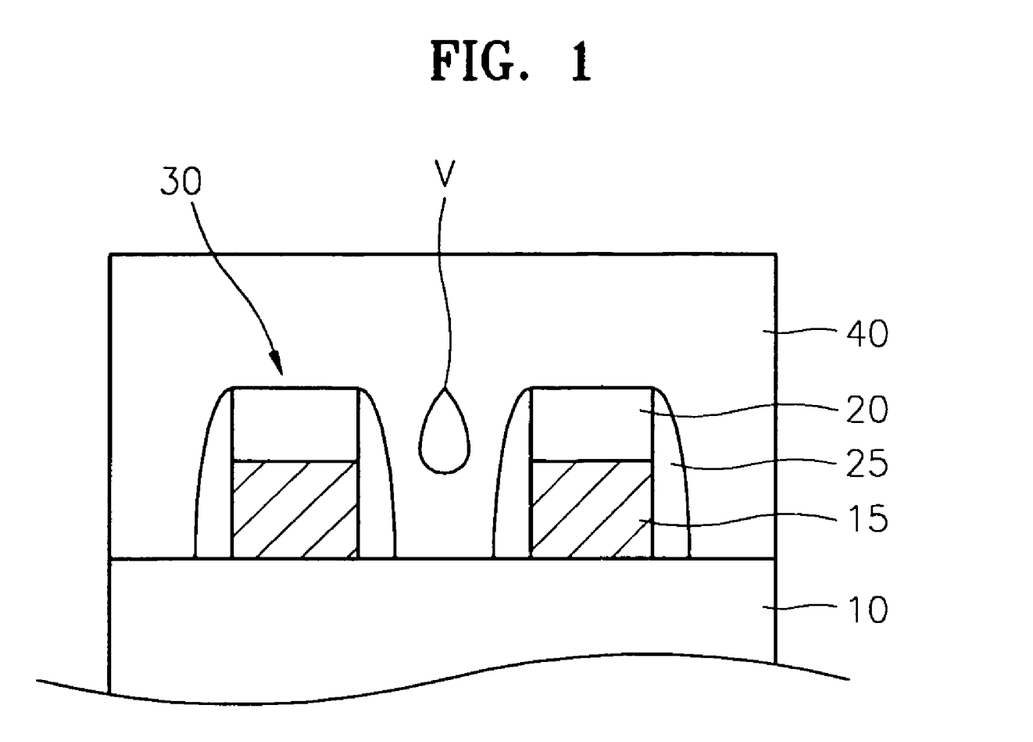
FIG. 1 shows a void that occurs in a gap fill insulating layer of a conventional semiconductor device.

Referring to FIG. 1, conventionally, an interlayer dielectric (ILD) 10 is formed on a substrate (not shown) on which a lower structure is formed. A bit line conductive layer 15 and a bit line capping layer 20 are formed on the ILD 10. To form the bit line conductive layer 15 and the bit line capping layer 20, a conductive material for a bit line and an insulating material for a bit line capping layer are sequentially stacked on the ILD 10 and then patterned using a photolithographic process. Next, spacers 25 are formed on the sidewalls of the bit line conductive layer 15 and the bit line capping layer 20. Thus, a bit line 30, which includes the bit line conductive layer 15, the bit line capping layer 20, and the spacers 25, is completed.

As the design rule is reduced, the critical dimension (CD) of the bit line becomes 100 nm or less. However, the foregoing conventional method using photolithographic exposure equipment cannot obtain finer bit line patterns. Thus, sufficiently reducing the cell size becomes difficult. Since the width of a bit line cannot be reduced, the misalignment margin between the bit line and a storage node contact hole to be formed later becomes very small. Also, the misalignment margin between a bit line and a bit line contact plug may be reduced, thus causing problems such as leakage.

Referring again to FIG. 1, a gap fill insulating layer 40 is formed to fill a gap between bit lines 30. However, as the gap between the bit lines 30 decreases with the reduced design rule, a void V frequently occurs in the gap fill insulating layer 40, as shown in FIG. 1. When the void V is filled with a conductive material for storage node contact plugs, a bridge phenomenon may occur between the storage node contact plugs.

SUMMARY OF THE INVENTION

An aspect of the present invention is to provide a method of fabricating a semiconductor device, in which, despite the reduced design rule, bit line patterns can be easily formed and the process margin can be sufficiently secured.

Another aspect of the present invention is to provide a semiconductor device including a bit line, in which the misalignment margin between the bit line and a storage node contact hole is increased.

In accordance with an exemplary embodiment of the present invention, there is provided a method of fabricating a semiconductor device, which comprises forming an insulating layer on a substrate, forming a groove by etching the insulating layer to a partial depth, and forming spacers on the inner walls of the groove. Afterwards, the insulating layer disposed under the groove is etched by using the spacers as an etch mask so as to form an opening in the insulating layer. Next, a conductive layer is formed using a damascene technique to fill the opening. A capping layer is formed on the conductive layer to fill the groove.

In accordance with another exemplary embodiment of the present invention, gate stacks and source/drains are formed over the substrate, a first insulating layer is formed to fill a gap between the gate stacks, and the first insulating layer is planarized. A first cell pad and a second cell pad are formed in the first insulating layer and connected to each source and each drain, respectively. A second insulating layer is then formed on the resultant structure where the first cell pad and the second cell pad are formed. A bit line contact plug is formed in the second insulating layer to contact the second cell pad. A third insulating layer is then formed on the resultant structure. The third insulating layer is etched using a mask pattern formed on the third insulating layer as an etch mask to a partial depth, thereby forming a groove. Afterwards, spacers are formed on the inner walls of the groove. The third insulating layer disposed under the groove is etched using the spacers and the mask pattern as an etch mask, thereby forming a bit line opening, which exposes the bit line contact plug. Due to the spacers, the bit line opening is formed to be narrower than the groove. Next, a bit line conductive layer is formed to fill the bit line opening to below the bottom of the spacers. That is, the bit line conductive layer is formed using a damascene technique. Afterwards, a bit line capping layer is formed to fill the groove so that its top surface is as high as that of the third insulating layer.

In embodiments of the present invention, the dimension of an opening or a bit line opening is adjusted by controlling the width of the spacers formed on the inner walls of a groove. Accordingly, it is possible to form a conductive layer or a bit line conductive layer to below the photolithographic limit.

In accordance with another exemplary embodiment of the present invention, there is provided a semiconductor device, which comprises an insulating layer having a T-shaped groove formed by a wide opening overlapping a narrow opening, a bit line conductive layer that at least partially fills the narrow opening, and a bit line capping layer that fills the groove so that its top surface is as high as that of the insulating layer. Spacers are formed on the inner walls of the wide opening. The bit line conductive layer may include a Ti layer, a TiN layer, and a W layer, which are inwardly and sequentially stacked. An interface between the spacer and the insulating layer is flat.

According to various exemplary embodiments of the present invention, formation of a bit line employs not a photolithographic process but a damascene technique. Thus, even a bit line having the reduced design rule can be easily formed. Also, misalignment between a bit line and a lower conductive element (e.g., a bit line contact plug), which occurs due to the reduced design rule, can be minimized. Further, because the dimension of a bit line opening is adjusted by controlling the width of the spacers, a bit line conductive layer can be formed to below the photolithographic limit. In addition, as it is not required to fill a gap between bit lines with a gap fill insulating layer, a void does not occur in the gap fill insulating layer. The present invention is not limited to bit lines but can also be applied to adjacently formed conductive layers, such as, for example, various interconnections or gate lines.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will be described more fully hereinafter with reference to the accompanying drawings in which preferred embodiment of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. To facilitate understanding, identical reference numerals have been used, where possible, to designate elements that are common among the figures.

FIGS. 2 through 9 are cross-sectional views illustrating a method of fabricating a semiconductor device according to a first embodiment of the present invention. While the following embodiments will be described with reference to a method of fabricating bit lines of DRAMs, it should be apparent to those skilled in the art that a similar description can be applied to other conductive lines, gate lines, or interconnections.

Figure 2:
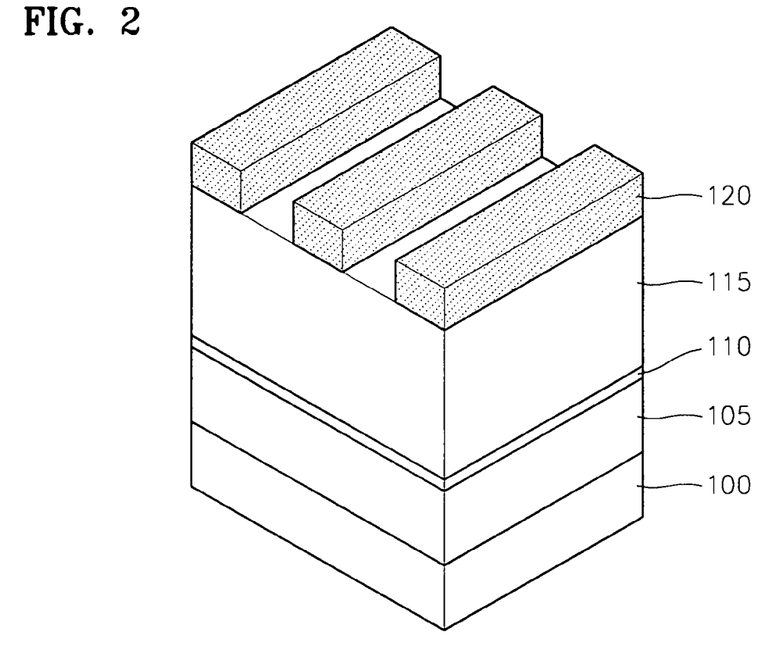
FIGS. 2 through 9 are cross-sectional views illustrating a method of fabricating a semiconductor device according to a first embodiment of the present invention.

Referring to FIG. 2, an etch stop layer 110 and a silicon oxide layer 115 are sequentially formed on a substrate 100 on which a lower structure including an insulating layer 105 is formed. The substrate 100 can be, for example, a single crystalline silicon substrate. The etch stop layer 110 is formed of an insulating material having an etch selectivity with respect to the silicon oxide layer 115. For example, the etch stop layer 110 is formed by depositing a silicon nitride layer to a thin thickness using plasma enhanced-CVD (PE-CVD) or low pressure-CVD (LP-CVD). Also, the etch stop layer 110 may be formed using a reaction between $SiH_4$ and $NH_3$ at a temperature of 500° C. to 850° C. The etch stop layer 110 may be selectively omitted. While the silicon oxide layer 115 is typically formed using CVD, it is possible to use PE-CVD or plasma-enhanced tetra ethyl ortho silicate (PE-TEOS) instead. The PE-CVD process uses a reaction between $SiH_4$ and $O_2$ (or $N_2O$), and the PE-TEOS process uses a reaction between $Si(OC_2H_5)_4$ and $O_2$ (or $O_3$).

Next, a mask pattern 120 is formed on the silicon oxide layer 115. The mask pattern is formed of an insulating material (e.g., silicon nitride) having an etch selectivity with respect to the silicon oxide layer 115. The mask pattern is formed by depositing a silicon nitride layer and patterning it using a photolithographic process. In place of silicon nitride, silicon oxynitride may be deposited to form the mask pattern 120.

Figure 3:
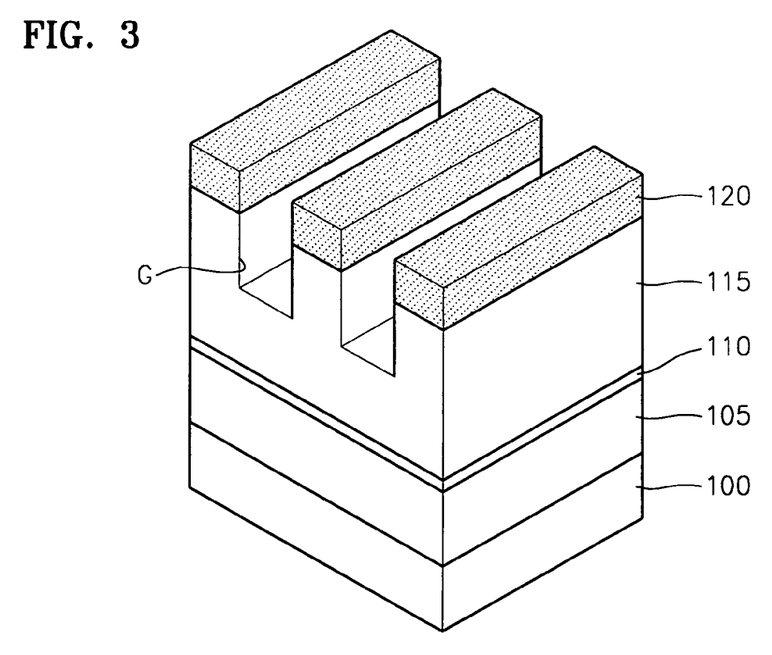

Next, as shown in FIG. 3, the silicon oxide layer 115 is etched to a partial depth using the mask pattern 120 as an etch mask, thereby forming grooves G in the silicon oxide layer 115. The depth of the grooves G is determined in consideration of the resistance of a conductive layer (e.g., a bit line) to be formed later. According to the present embodiment, the height of the conductive layer is equal to or less than the thickness of the silicon oxide layer remaining below the grooves G. Therefore, if it is desired that the height of the conductive layer increase to reduce the resistance of the conductive layer, the grooves G may be formed to a shallow depth.

Figure 4:
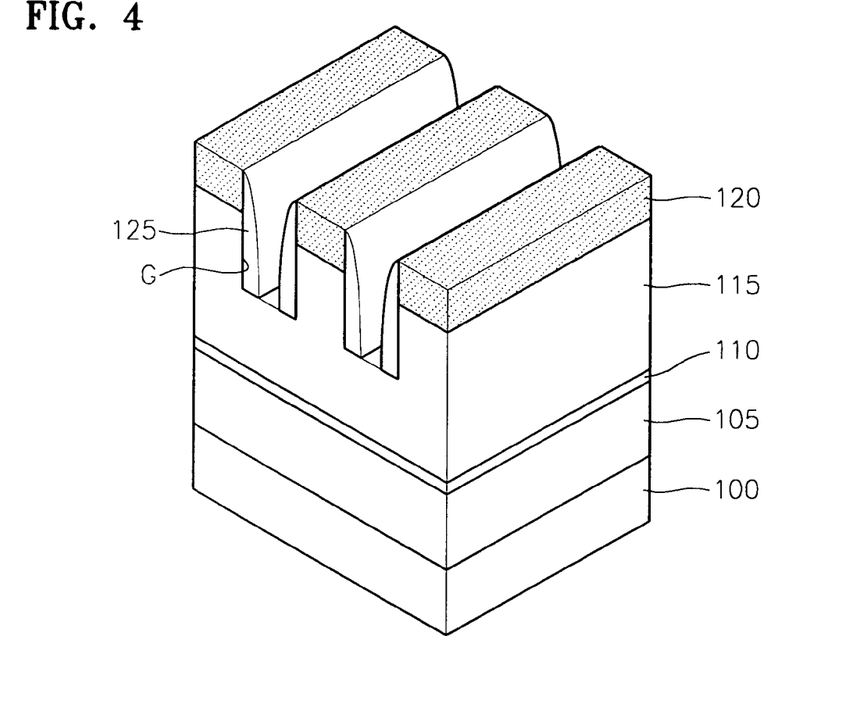

Referring to FIG. 4, spacers 125 are formed on the inner walls of the grooves G. To form the spacers 125, an insulating layer for spacers is deposited to a thin thickness and etched using an anisotropic etch process. The spacers 125 are preferably formed of a material having an etch selectivity with respect to the silicon oxide layer 115. Thus, the spacers 125 are preferably formed of silicon nitride. Also, it is necessary to control the width of the spacers 125 to adjust the dimension of a subsequent opening.

Figure 5:
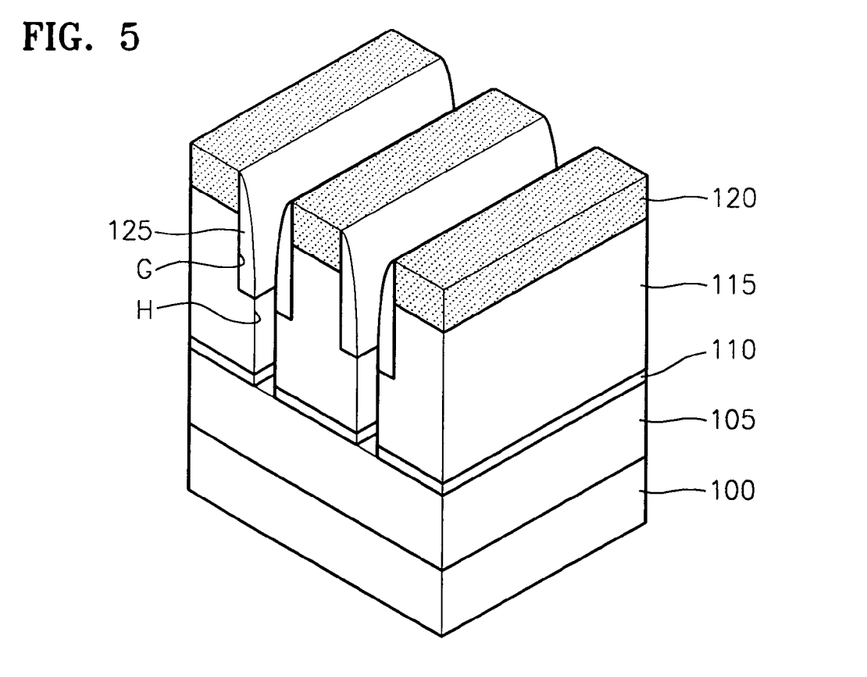

Next, as shown in FIG. 5, the silicon oxide layer 115, which is exposed under the grooves G, is etched using the spacers 125 and the mask pattern 120 as an etch mask, thereby forming openings H. In FIG. 5, the etch stop layer 110 disposed under the openings H is also etched so as to expose conductive elements (e.g., a contact pad or a contact plug) included in the insulating layer 105. While the silicon oxide layer 115 is being etched, the etch stop layer 110 can reliably prevent the insulating layer 105 disposed under the etch stop layer 110 or the conductive elements included in the insulating layer 105 from being etched. However, even if the etch stop layer 110 is omitted, the similar effect can be obtained by controlling the etch time.

Figure 6:
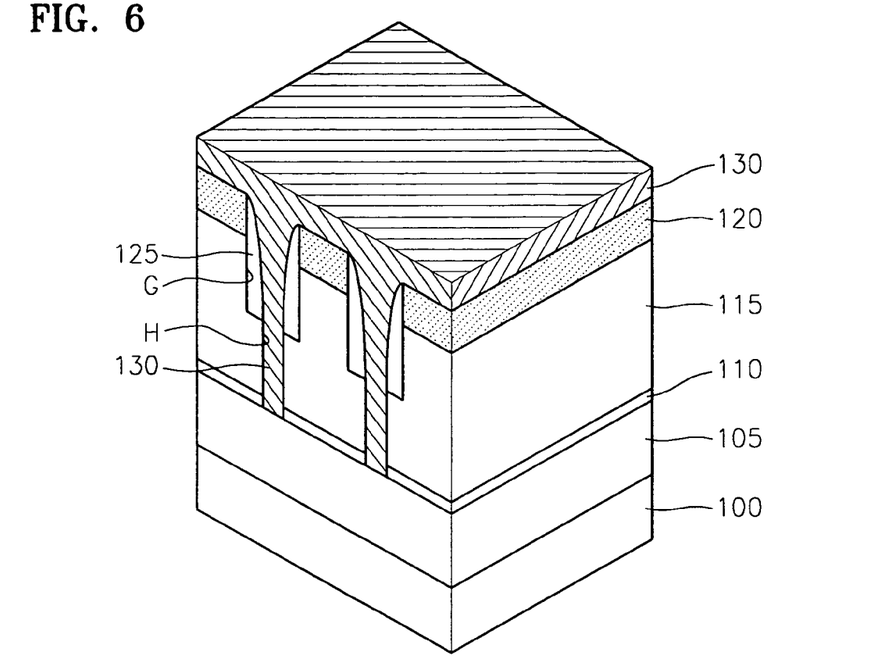
Figure 7:
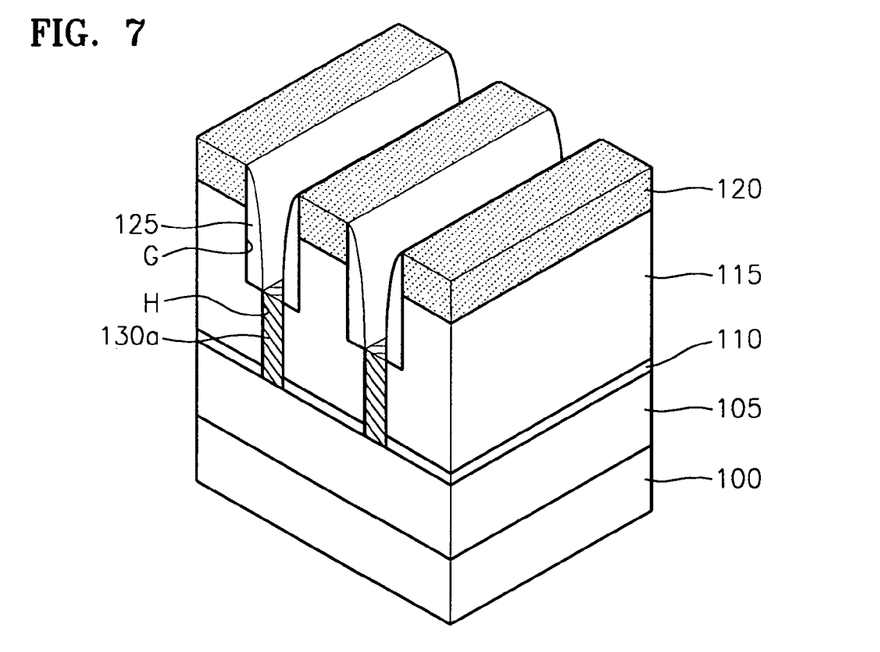

FIGS. 6 and 7 show a step of forming a bit line by filling the openings H with a conductive material according to the first embodiment. As shown in FIG. 6, a conductive material is deposited to a sufficient thickness, thereby forming a conductive layer 130 that completely fills the openings H and the grooves G. Next, the conductive layer 130 is etched using an etchback process or wet-stripping to remain only under the spacers 125. Reference numeral 130a denotes the conductive layer remaining only in the openings H. FIG. 7 shows the conductive layer 130a that is formed to be as high as the bottom of the spacers 125. The height of the conductive layer 130a is preferably as high as or lower than the bottom of the spacers 125. In this case, a short between the conductive layer 130a and other conductive elements to be formed later can be prevented.

Figure 8:
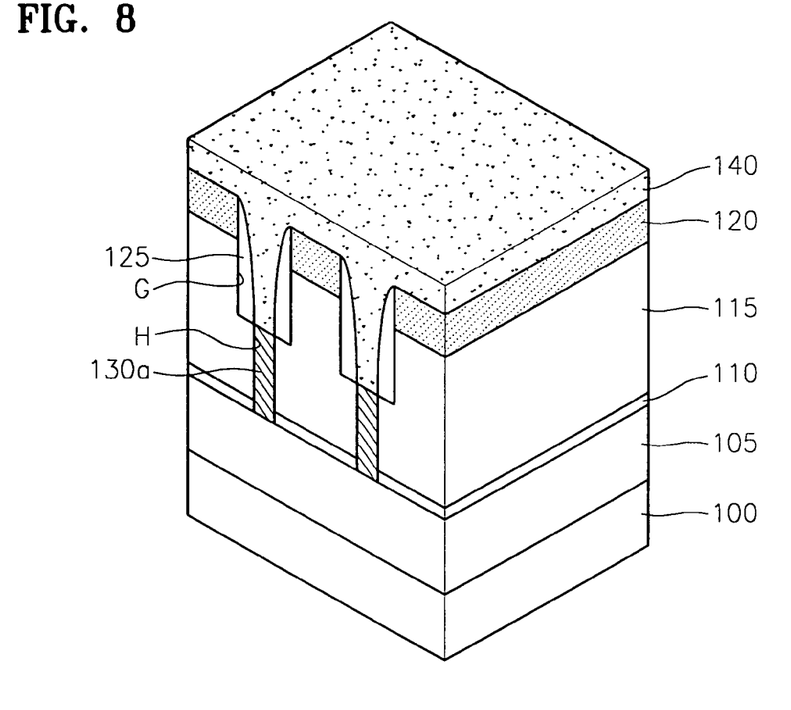
Figure 9:
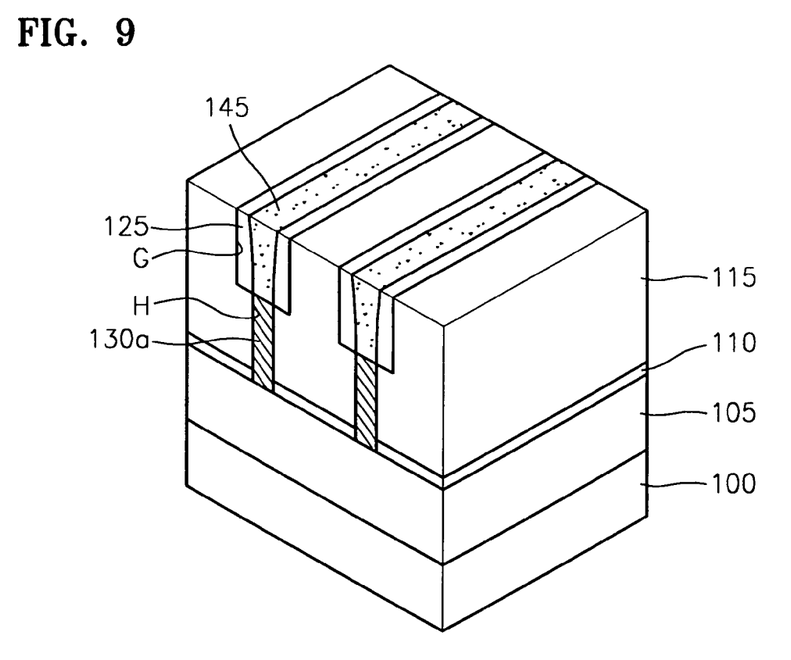

Afterwards, as shown in FIG. 8, an insulating material 140 is deposited over the conductive layer 130a so as to completely fill the grooves G. The insulating material 140 preferably has an etch selectivity with respect to the silicon oxide layer 115, which facilitates a subsequent process of forming a storage node contact hole. Next, the top surface of the resultant structure where the insulating material 140 is deposited is planarized until the silicon oxide layer 115 is exposed. Thus, as shown in FIG. 9, a capping layer 145 filling the grooves G is formed. In a semiconductor device formed using the foregoing method, an interface between the spacers 125 and the silicon oxide layer 115 is flat. That is, the section of the interface therebetween is L-shaped.

Next, FIGS. 10 through 13 are cross-sectional views illustrating a method of fabricating a semiconductor device according to a second embodiment of the present invention. FIG. 14 is an example layout of a cell region of the semiconductor device according to the second embodiment of the present invention. In each of FIGS. 10 through 13, the left structure is taken along line a–a' of FIG. 14, while the right structure is taken along line b–b' of FIG. 14.

Before the second embodiment is described in detail, characteristics of the present embodiment will be described for clarity. In a DRAM, after a bit line contact plug is formed, a silicon nitride layer, which has an etch selectivity with respect to an interlayer dielectric (ILD) (hereinafter, referred to as a "second insulating layer"), is deposited to a thin thickness. The silicon nitride layer is used as an etch stop layer during the formation of a bit line opening to prevent over-etching of a bit line contact plug of a cell array region. Spacers are formed using, for example, silicon nitride, on the inner walls of the bit line opening. As a result, a bit line can be formed to below the photolithographic limit and the misalignment margin between the bit line and a storage node contact plug can be increased.

Figure 10:
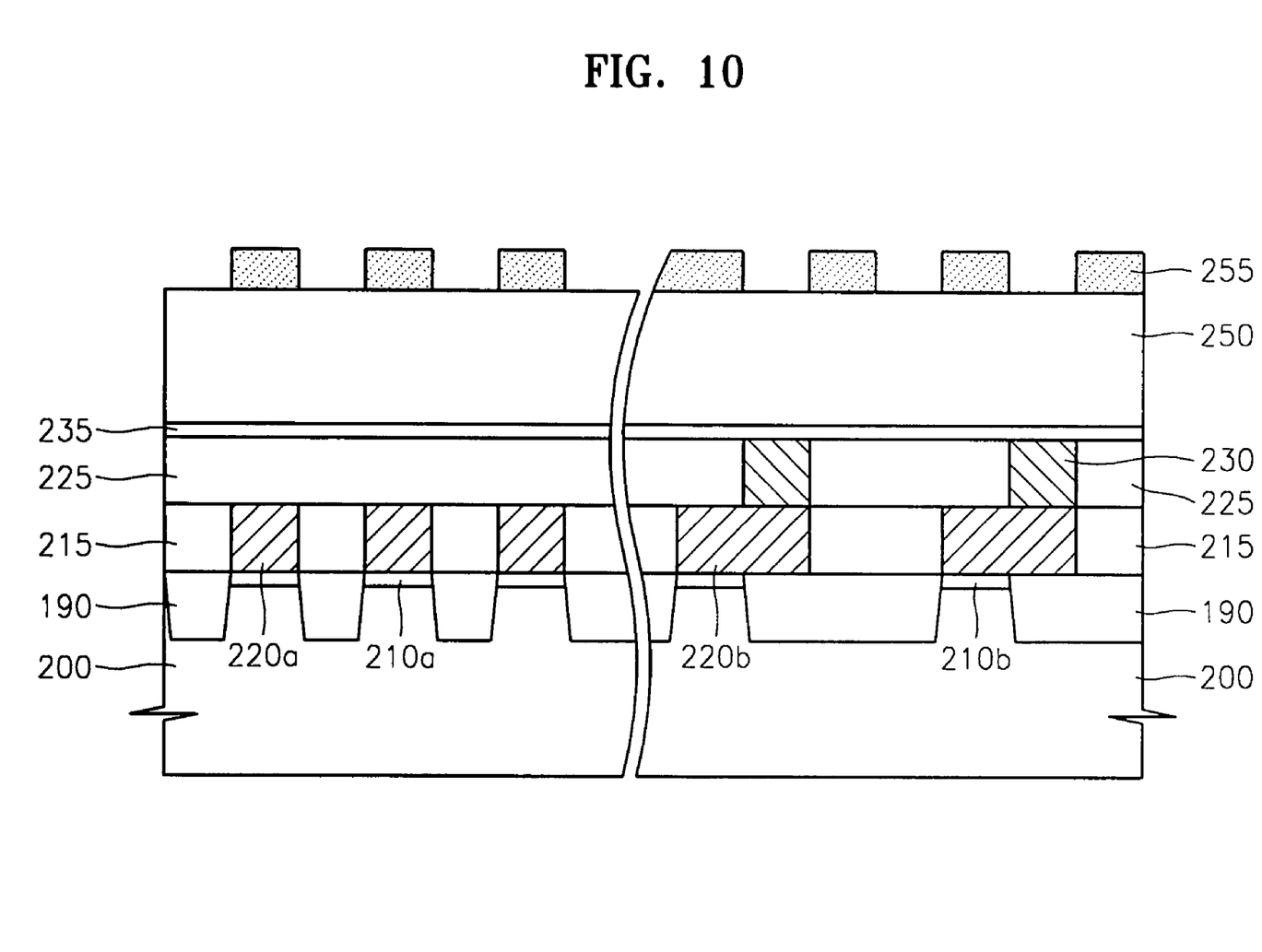
FIGS. 10 through 13 are cross-sectional views illustrating a method of fabricating a semiconductor device according to a second embodiment of the present invention.

Referring to FIG. 10, a device isolation layer 190 (e.g., a shallow trench isolation (STI) layer) is formed on a substrate 200 to define an active region. While the active region may be bar-shaped as shown in FIG. 14, it is possible to form the active region in the shape of a T. A well is formed on the active region, and an ion implantation process is implemented to control the threshold voltage of a transistor. Next, a plurality of gate stacks (205 of FIG. 14) and source/drains 210a and 210b are formed on/in the active region. Here, it is assumed that the gate stacks each include a gate insulating layer, a gate conductive layer, a gate capping layer, and gate spacers formed on the sidewalls thereof. The gate conductive layer may be formed of, for example, doped polysilicon, a double layer of doped polysilicon and tungsten silicide, or tungsten.

Afterwards, cell pads 220a and 220b are formed to contact the source/drains. The cell pads 220a and 220b are formed by a known method of forming self-aligned contacts. That is, a first insulating layer 215 is deposited to fill a gap between the gate stacks and then planarized. The first cell pad 220a and the second cell pad 220b are formed in the first insulating layer 215 and are coupled to each source 210a and each drain 210b, respectively. Then, a second insulating layer 225 is formed on the first insulating layer 215 and the first cell pad 220a and the second cell pad 220b. Thereafter, a bit line contact plug 230 is formed in the second insulating layer 225 to contact the second cell pad 220b. However, it is possible to omit the cell pads 220a and 220b. In this case, the bit line contact plug 230 is formed to directly contact the drain 210b. In the second embodiment, the total height of the first insulating layer 215 and the second insulating layer 225 is about 2000 Å. Then, a thin etch stop layer 235 is formed on the second insulating layer 225. The etch stop layer 235 is formed of a material (e.g., silicon nitride) having an etch selectivity with respect to a third insulating layer 250 to be formed later. The etch stop layer 235 is formed using PE-CVD or LP-CVD to a thickness of 300 Å to 500 Å.

Next, a third insulating layer 250 is formed on the etch stop layer 235 using, for example, silicon oxide. The third insulating layer 250 is formed to a thickness of 1000 Å to 5000 Å and preferably about 4500 Å. Then, a mask pattern 255 is formed on the third insulating layer 250 to expose a portion where a bit line will be formed. In an actual semiconductor device, since the ratio of bar to space required for formation of a bit line is about 2:3, despite the reduced design rule of a bit line, bit lines can be easily formed according to the present embodiment. Also, based on results of tests performed by the inventors, it has been confirmed that a sufficient thickness of the mask pattern 225 is as much as 1000 Å.

Figure 11:
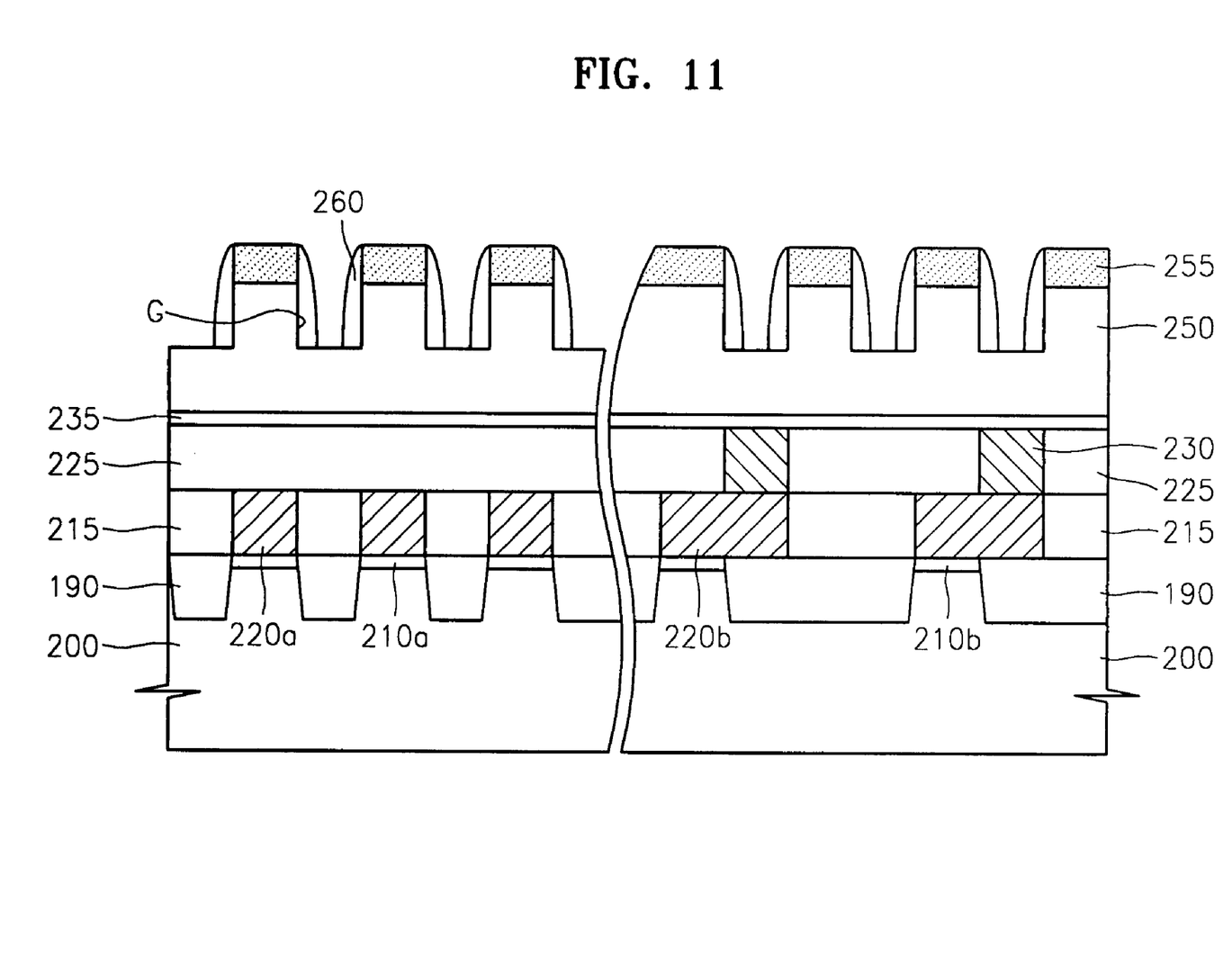

Referring to FIG. 11, the third insulating layer 250 is etched to a partial depth using the mask pattern 255 as an etch mask, thereby forming grooves G. Then, spacers 260 are formed on the inner walls of the grooves G. The width of the grooves G is equal to or less than that of a conventional bit line. To form the spacers 260, a silicon nitride layer is formed on the entire surface of the third insulating layer 250 so as not to completely fill the grooves G. That is, the silicon nitride layer is formed to a thickness of, for example, 300 Å to 500 Å. Next, the silicon nitride layer is etched using an anisotropic etch process until the top surface of the mask pattern 255 and the bottom of the grooves G are exposed. After the etch process is completed, the widths of the spacers 260 becomes about 200 Å. During the etch process, the thickness of the mask pattern 255 may be reduced to about 300 Å. The resultant spacers 260 can be used as an etch mask when the third insulating layer 250 and the second insulating layer 225 are etched to form a storage node contact hole. Also, by controlling the width of the spacers 260, the dimension of a subsequent bit line opening, i.e., the CD of a bit line conductive layer, can be appropriately adjusted.

Figure 12:
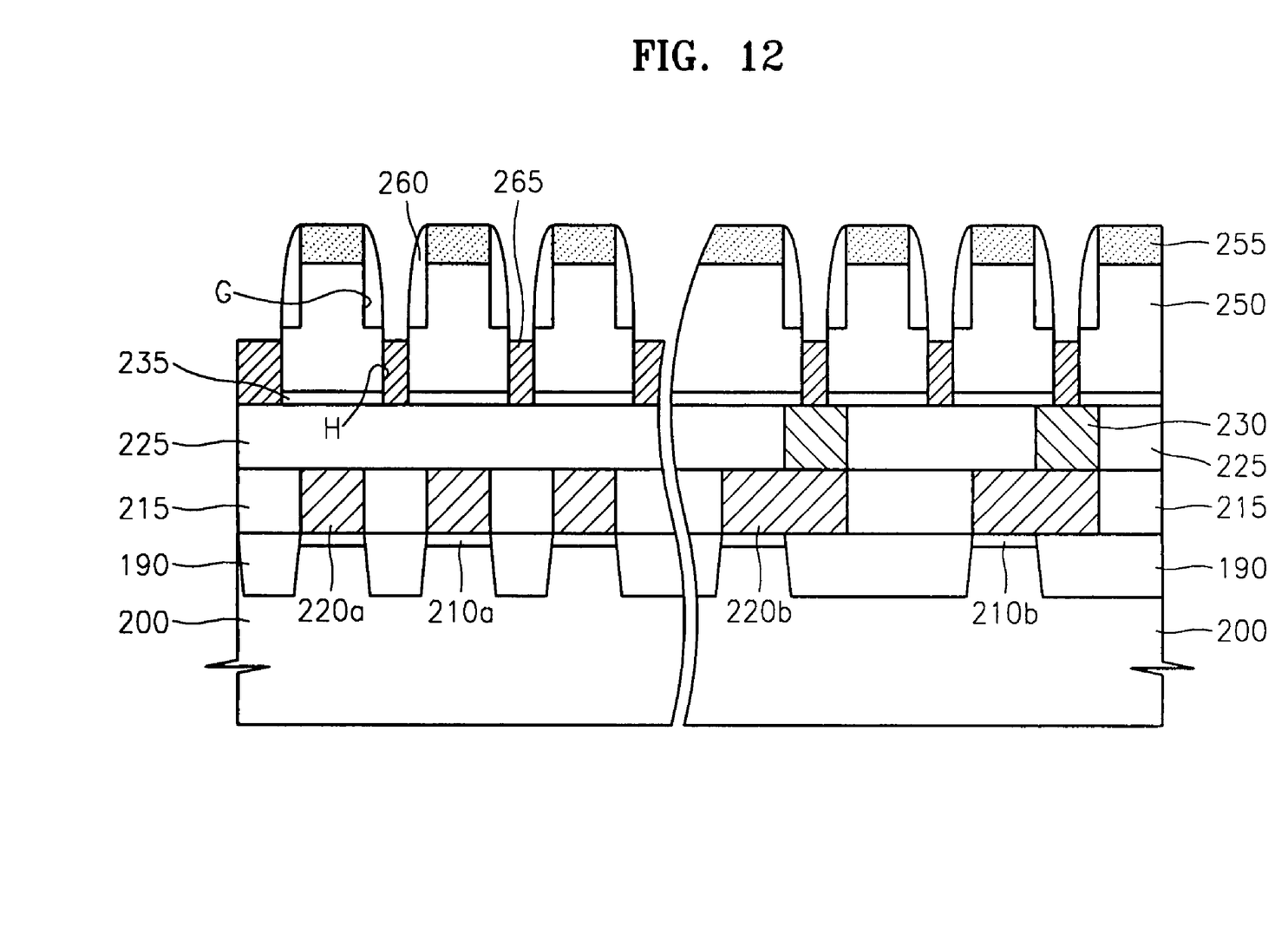

Next, as shown in FIG. 12, the third insulating layer 250 disposed under the grooves G is etched using the spacers 260 and the mask pattern 255 as an etch mask, thereby forming a bit line opening H, which exposes the bit line contact plug 230. Preferably, an anisotropic dry etch process is employed. Here, the etch process may be performed using etching gas containing $C_4H_8/C_3H_8$, $C_2F_6$, $C_2F_4$, $C_3F_6$, $C_3F_8$, $C_4F_6$, $C_4F_8$, $C_5F_8$, $C_5F_{10}$, or $C_2HF_5$. Alternatively, gases obtained by adding one of $CH_3F$, $C_2H_2$, and $CH_2F_2$ and one of Ar, He, Xe, and Ne to the gases $C_4H_8/C_3H_8$, $C_2F_6$, $C_2F_4$, $C_3F_6$, $C_3F_8$, $C_4F_6$, $C_4F_8$, $C_5F_8$, $C_5F_{10}$, or $C_2HF_5$ can be used. The etch stop layer 235, which is formed of a material having an etch selectivity with respect to the third insulating layer 250, is not etched while the third insulating layer 250 is being etched and prevents etching damage to the bit line contact plug 230. Afterwards, the etch stop layer 235 exposed in the bit line openings H also is removed to allow the bit line contact plug 230 to be reliably exposed without over-etching. Thus, a short between a gate conductive layer of the gate stack (205 of FIG. 14) and the bit line can be prevented. Also, the spacers 260 enable the dimension of the resultant bit line openings H to be reduced to below the photolithographic limit unlike the CD of the conventional bit line. That is, if the width of the grooves G is about 80 nm and the width of the spacers 260 is about 200 Å, the bit line openings H can be formed to about 40 nm. Even if the CD of a bit line, which can be obtained using photolithographic exposure equipment, is limited to 90 nm, according to the present invention, bit lines can be formed to a CD of about 40 nm.

Next, a conductive layer (not shown) is formed on the entire surface of the substrate 200 to completely fill the bit line openings H and the grooves G. For example, tungsten (W) is deposited to a thickness of about 3000 Å. Before the conductive layer is formed, a barrier layer may be further formed. For example, as the barrier layer, a Ti layer and a TiN layer may be formed to a thickness of 100 Å and 250 Å, respectively. Here, a silicide layer may be further formed on a portion of the conductive layer using a silicidation process. Also, in place of tungsten, the conductive layer may be formed of one of doped polysilicon, aluminium, copper, and titanium. Next, a portion of the conductive layer is etched using an etchback process or wet-stripping so as to remain below the bottom of the spacers 260. FIG. 12 shows an example where the bit line conductive layer 265 is formed to be lower than the bottom of the spacers 260. That is, the bit line conductive layer 265 is completely filled in the bit line openings H and surrounded by the spacers 260 and the third insulating layer 250.

According to at least one embodiment of the present invention, since the bit line conductive layer 265 is formed without a photolithographic process, in spite of the reduced design rule, the bit line conductive layer 265 can be easily formed. Also, because the bit line is formed using a damascene technique after the third insulating layer 250 is formed, it is not required to fill a gap between the bit lines with a gap fill insulating layer. Thus, a void does not occur in the gap fill insulating layer, thus preventing a bridge phenomenon between subsequent storage node contact plugs. Further, as a stable insulation characteristic can be secured, the breakdown voltage between the bit line conductive layers 265 or between the bit line conductive layer 265 and a subsequent storage node contact plug can be improved.

Figure 13:
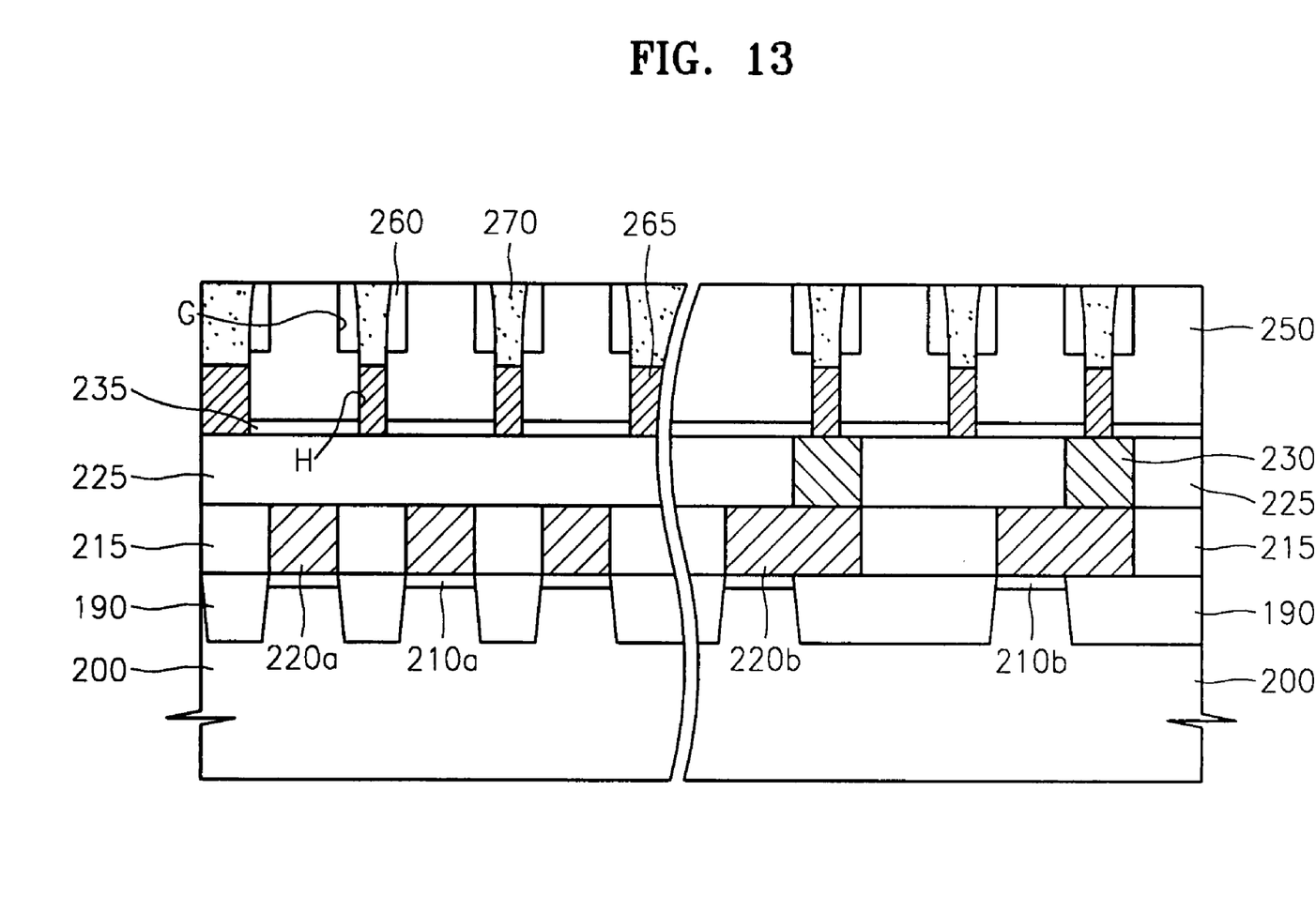
Figure 14:
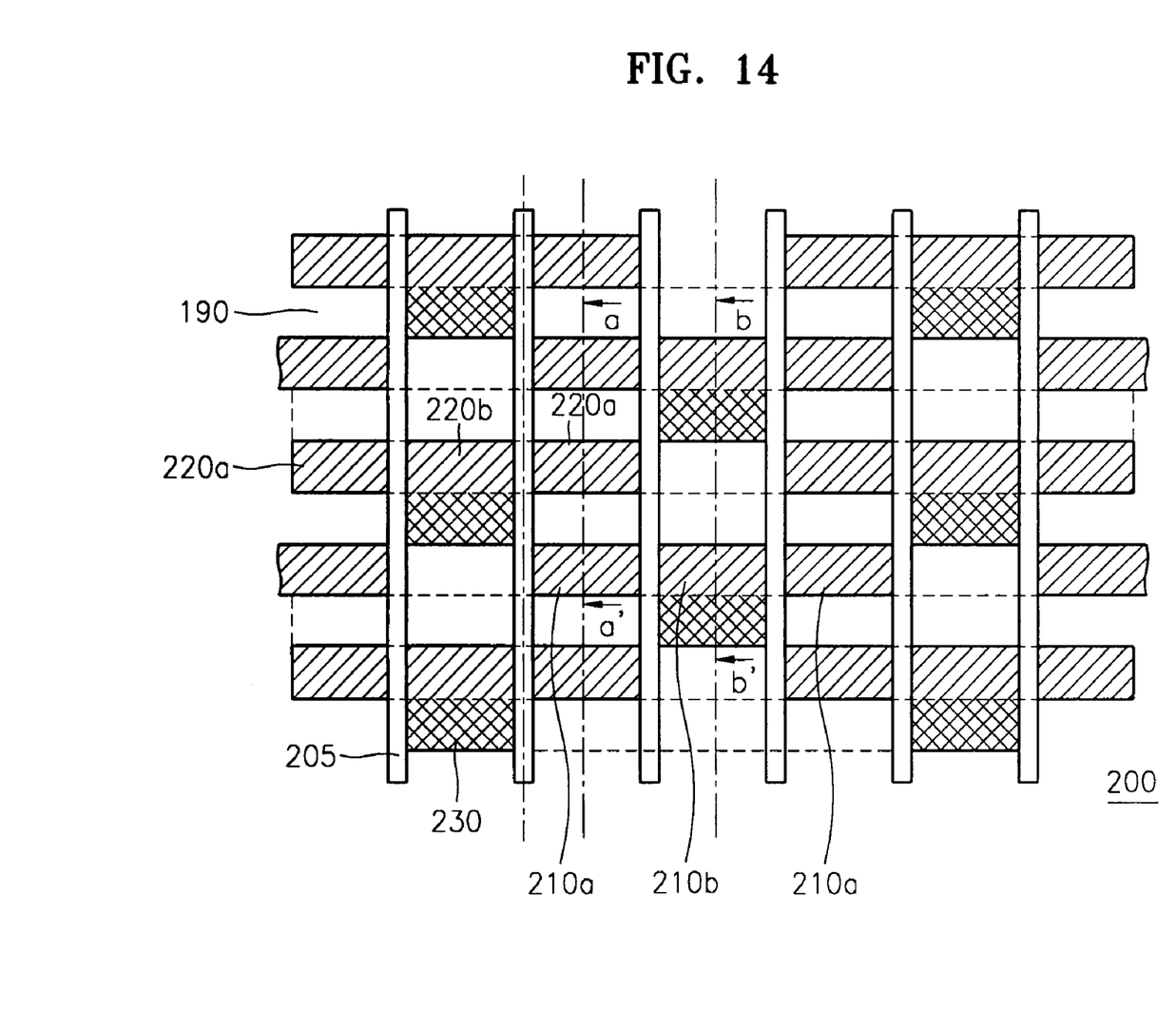
FIG. 14 shows an example layout of a cell region of a semiconductor device according to the second embodiment of the present invention.

Referring to FIG. 13, an insulating layer (not shown) for a bit line capping layer is formed on the entire surface of the resultant structure of FIG. 12 to completely fill the bit line openings H. Then, an etchback process or a CMP process is carried out until the top surface of the third insulating layer 250 is exposed, thereby forming a bit line capping layer 270, the top surface of which is as high as that of the third insulating layer 250. The bit line capping layer 270 fills the bit line openings H and the grooves G over the bit line conductive layer 265. The bit line capping layer 270 is used as an etch mask during a subsequent etch process for forming a storage node contact hole and prevents a short between a storage node contact plug filling the storage node contact hole and the bit line conductive layer 265. Accordingly, in a case where the third insulating layer 250 is formed of silicon oxide, the bit line capping layer can be formed of silicon nitride. Here, the bit line capping layer may be formed to a thickness of about 1000 Å to 5000 Å.

As shown in FIG. 13, in the semiconductor device of the present invention, an interface between the spacers 260 and the third insulating layer 250 is formed to be flat. Thus, the third insulating layer 250 can be selectively etched without damaging the bit line capping layer 270 and the spacers 260 during a subsequent process of etching the storage node contact hole. The flat interface allows the etch selectivity between the third insulating layer 250 and the spacers 260 to reach 20:1. However, in the conventional method of FIG. 1, the shoulder portions of the spacers 25 are round and have an etch selectivity that is as high as 8:1. That is, according to the present invention, a short between the bit line conductive layer 265 and the storage node contact plug can be effectively prevented. Since the misalignment margin is secured by protecting the shoulder portions, process simplification and reproducibility can be obtained.

The semiconductor device according to exemplary embodiments of the present invention comprises an insulating layer (the third insulating layer 250 of the second embodiment) including T-shaped grooves (a composition of G and H) in which a wide opening and a narrow opening are overlapped at right angles, a bit line conductive layer 265 which wholly or partially fills the narrow openings H, and a bit line capping layer 270, which fills the T-shaped grooves over the bit line conductive layer 265, with its top surface as high as that of the insulating layer 250. Also, the spacers 260 are formed on the inner walls of the wide openings G. The bit line conductive layer 265 may include a Ti layer, a TiN layer, and a W layer, which are inwardly and sequentially stacked. An interface between the spacers 260 and the insulating layer 250 is flat.

In addition, conventionally, as shown in FIG. 1, the CD of the bit line conductive layer is equal to that of the capping layer formed thereon. In at least one embodiment of the present invention, the CD of the bit line conductive layer becomes less than that of the capping layer.

As described above, a bit line is formed using a damascene technique instead of a conventional photolithographic process. Thus, in spite of the reduced design rule, the bit line can be easily formed. Also, misalignment between a bit line and a bit line contact plug, which may occur due to the reduced design rule, can be minimized. Also, since a bit line is formed using a damascene technique after an insulating layer is formed, forming a capping insulating layer in a gap between bit lines is not required. Thus, a void does not occur in a gap fill insulating layer. Unlike the conventional method, a capping layer is finally formed, thus minimizing etching damages of the top surface of the capping layer. As a result, a short phenomenon can be minimized. In view of the foregoing effects, the present invention can be widely applied to semiconductor devices having a design rule of 0.09 μm or less.

Further, over-etching of a bit line contact plug can be minimized, thus preventing a short between a gate conductive layer of a gate stack and a bit line. Bit lines can be formed to below the photolithographic limit, and the misalignment margin between a bit line and a storage node contact hole can increase. Also, insulating characteristics become stable to improve the breakdown voltage between bit line conductive layers or between a bit line conductive layer and a subsequent storage node contact plug.

In particular, an interface between spacers and an insulating layer is flat. This enables an etch selectivity between the spacers and the insulating layer to be higher than that in a conventional device including round shoulder portions. Thus, the insulating layer can be selectively etched without damaging a bit line capping layer and the spacers during a process of etching a storage node contact hole. Accordingly, a short between the bit line and a storage node contact plug filled in a storage node contact hole can be prevented.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A method of fabricating a semiconductor device, the method comprising:
    forming an insulating layer over a substrate;
    forming a groove by etching the insulating layer to a partial depth;
    forming spacers on inner walls of the groove;
    forming an opening in the insulating layer by etching the insulating layer disposed under the groove by using the spacers as an etch mask;
    forming a conductive layer in the opening; and forming a mask in the groove with said spacers, wherein forming the conductive layer comprises:
  forming a conductive layer to completely fill the opening and the groove; and
  etching the conductive layer using an etchback process to below the bottom of the spacers.

2. A method of fabricating a semiconductor device, the method comprising:
  forming an insulating layer over a substrate;
  forming a groove by etching the insulating layer to a partial depth;
  forming spacers on inner walls of the groove;
  forming an opening in the insulating layer by etching the insulating layer disposed under the groove by using the spacers as an etch mask;
  forming a conductive layer in the opening; and
  forming a mask in the groove with said spacers, wherein forming the conductive layer comprises:
  forming a conductive layer to completely fill the opening and the groove; and
  wet-stripping the conductive layer to below the bottom of the spacers.

3. A method of fabricating a semiconductor device, the method comprising:
  forming gate stacks and source/drains over a substrate;
  forming a first insulating layer to fill a gap between the gate stacks;
  planarizing the first insulating layer;
  forming a first cell pad and a second cell pad in the first insulating layer, the first cell pad and the second cell pad being connected to each source and each drain, respectively;
  forming a second insulating layer over the first insulating layer and the first cell pad and the second cell pad;
  forming a bit line contact plug in the second insulating layer to contact the second cell pad;
  forming a third insulating layer over the second insulating layer and the bit line contact plug;
  forming a mask pattern over the third insulating layer;
  forming a groove by etching the third insulating layer to a partial depth using the mask pattern as an etch mask;
  forming spacers on the inner walls of the groove;
  forming a bit line opening, which exposes the bit line contact plug, by etching the third insulating layer disposed under the groove using the spacers and the mask pattern as an etch mask;
  forming a bit line conductive layer that fills the bit line opening below the bottom of the spacers; and
  forming a bit line capping layer that fills the groove so that its top surface is as high as that of the third insulating layer.

4. The method of claim 3, wherein depositing the third insulating layer comprises forming an etch stop layer using silicon nitride followed by forming a silicon oxide layer.

5. The method of claim 3, wherein forming the spacers comprises:
  forming a silicon nitride layer over the third insulating layer so as not to completely fill the groove; and
  etching the silicon nitride layer using an anisotropic etch process until the top surface of the mask pattern and the bottom of the groove are exposed.

6. The method of claim 3, wherein forming the bit line conductive layer comprises:
  forming a conductive layer that completely fills the bit line opening and the groove; and
  etching the conductive layer using an etchback process to below the bottom of the spacers.

7. The method of claim 3, wherein forming the bit line conductive layer comprises:
  forming a conductive layer to completely fill the bit line opening and the groove; and
  wet-stripping the conductive layer to below the bottom of the spacers.

8. The method of claim 3, wherein the conductive layer is formed of a Ti layer, a TiN layer, and a W layer, which are sequentially stacked.

9. The method of claim 3, wherein an interface between the spacers and the third insulating layer is flat.

10. The method of claim 3, wherein forming the bit line capping layer comprises:
  forming a silicon nitride layer over the substrate where the bit line conductive layer is formed to completely fill the groove; and
  etching the silicon nitride layer using an etchback process or a chemical mechanical polishing process until the top surface of the third insulating layer is exposed.

11. The method of claim 3, wherein the dimension of the opening is adjusted by controlling the width of the spacers.

* * * * *